(12) United States Patent
Jaffer et al.

(10) Patent No.: US 7,729,428 B2
(45) Date of Patent: Jun. 1, 2010

(54) METHOD AND APPARATUS FOR RECOGNIZING A CHANGE-OF-STATE IN COMMUNICATION SIGNALS OF ELECTRONIC CIRCUITS

(75) Inventors: Adil Jaffer, Markham (CA); Dale Finney, Oshawa (CA); Zhihong Mao, Stouffville (CA)

(73) Assignee: General Electric Company, Schenectady, NY (US)

( * ) Notice: Subject to any disclaimer, the term of this patent is extended or adjusted under 35 U.S.C. 154(b) by 721 days.

(21) Appl. No.: 11/617,087

(22) Filed: Dec. 28, 2006

(65) Prior Publication Data

US 2008/0159440 A1    Jul. 3, 2008

(51) Int. Cl.
*H04B 3/00* (2006.01)
(52) U.S. Cl. .................................. 375/257
(58) Field of Classification Search ............ 375/257, 375/287, 317, 377
See application file for complete search history.

(56) References Cited

U.S. PATENT DOCUMENTS

| | | | | |
|---|---|---|---|---|
| 5,398,261 A | * | 3/1995 | Marbot | 375/257 |
| 5,625,679 A | * | 4/1997 | Gutzmer | 379/93.37 |
| 6,476,587 B2 | * | 11/2002 | Sasaki | 320/166 |

\* cited by examiner

*Primary Examiner*—Khanh C Tran
(74) *Attorney, Agent, or Firm*—GE Global Patent Operation; Roger C. Philips; William Fitzpatrick

(57) ABSTRACT

A method for recognizing a valid change of state in a communication signal including capacitively coupled signals received by an input contact includes maintaining the input contact in a first state and an impedance of the first contact input in a first impedance level, validating that the communication signal sent from to the input contact is a valid change of state, and changing the input contact to a second state and the impedance of the first input contact input to a second impedance level when the voltage signal is validated. An input contact circuit is also disclosed.

19 Claims, 4 Drawing Sheets

METHOD AND APPARATUS FOR RECOGNIZING A CHANGE-OF-STATE IN COMMUNICATION SIGNALS OF ELECTRONIC CIRCUITS

BACKGROUND OF THE INVENTION

1. Field of the Invention

The present invention relates in general to electronic circuitries and, more particularly, to methods and apparatuses for recognizing a valid change-of-state of capacitively coupled signals using adaptively active impedance.

2. Description of the Related Art

It is common practice in industry to establish communication from a plurality of input contacts 2 of an electronic circuitry in one device to a plurality of output contacts 4 of another by connecting the corresponding contacts from each via a cable bundle 6, as illustrated in FIG. 1. One example of such is the connection of breaker contact outputs with a protection relay contact inputs in a substation of a power grid. When a breaker contact closes, a voltage is applied to the contact input. If that voltage is maintained above a preset threshold value for a predetermined amount of time (typically known as the debounce timer), the contact input recognizes that the applied voltage corresponds to a valid state change and thus the state of that input contact is changed from an OFF state to an ON state. The process is similar for an input transition from the ON state to the OFF state when the applied voltage drops below a second preset threshold for the duration of the debounce timer.

However, the long bundle of cables typically used to connect these devices is known to introduce large parasitic capacitive coupling between individual conductors carrying the monitored signals. This is illustrated in FIG. 2, where a simplified circuit is illustrated to represent the assembly of FIG. 1. In FIG. 2, the contact inputs 2 have respective impedance $R_a$ and $R_b$ and switches $SW_a$ and $SW_b$ represent the contact outputs 4. In operation, if switch $SW_a$ closes, a valid signal will appear continuously on the corresponding contact input $R_a$. However, a capacitively coupled signal will also discharge via a parasitic capacitance ($C_{line}$, as shown in FIG. 2) through the contact input $R_b$ (shown by the dotted line in FIG. 2), even though the switch $SW_b$ is open.

Two conventional solutions exist for the above-noted problem. The first includes increasing the debounce timer, and the second includes lowering of the input impedance. In order to reject the capacitively coupled pulse, a validation timer (also known as a debounce timer) can be used to ignore all pulses under a preset duration. The user must configure the debounce timer to ignore pulses with durations less than the worst-case capacitively coupled pulse. However, one of the drawbacks in increasing the duration of the debounce timer is that it delays the recognition of valid contact input transitions, which in turn can affect the efficiency of the protection scheme. Another approach used to mitigate the effects of capacitively coupled transients is to reduce the impedance of the contact input. By reducing this impedance the capacitively coupled signal has a shorter pulse duration that can then allow for a smaller debounce timer setting. However, another drawback of this solution is that the amount of power dissipated by the contact input circuitry increases as the impedance decreases, leading to a limitation in the number of contact inputs that may be available in the product. Therefore in order to prevent false input state changes due to capacitively coupled transients either the number of contact inputs must be reduced or the recognition time for an input state change must be increased.

Conventional solutions to the above-summarized challenge have involved finding a balance between response time (i.e., the time before the contact input can successfully determine if the signal was a transient pulse or a valid input state change) and power dissipation (i.e., how many contact inputs can be used in a device without destroying the circuitry through heat dissipation). However, this balance between power dissipation and contact input response time leads to the current practical limitations within the industry for the number of inputs that can be designed into a product as well as the practical limitations to the response time of a contact input to a valid signal transition Therefore, a need exist to control the impedance of a contact input such that the current consumed thereby is increased only during the period of time when the input is either in the OFF state or in a transition state and reduced during the period of time when the contact input is in the ON state, in which power consumption is at its peak. Such an approach will not only allow the contact input to consume substantially less power during steady state operation than conventional contact inputs, but will also allow for a significant improvement in recognition time. Since the contact input is only drawing an increased amount of current for a short duration, the amount of current drawn can be maximized for recognition time performance.

BRIEF SUMMARY OF THE INVENTION

One or more of the above-summarized needs and/or others known in the art are addressed by methods for recognizing a valid change of state in a communication signal received by a first input contact, such methods including the steps of maintaining the first contact input in a first state and an impedance of the first contact input in a first impedance level; validating that the communication signal sent from the first output contact to the first input contact is a valid change of state for the first input contact; and changing the first input contact to a second state and the impedance of the first input contact input to a second impedance level when the voltage communication signal is validated.

One or more of the above-summarized needs and/or others known in the art are also addressed by input contact circuits that include a signal converter electrically coupled to input connections of the input contact circuit; a switch electrically coupled to the input connections of the input contact circuit in parallel with the signal converter; a current generator electrically coupled in series to the switch; an impedance controller electrically coupled to the signal converter and the switch; and an input state logic circuit electrically coupled to the signal converter and configured to change a state of the input contact from a first state to a second state.

The above brief description sets forth features of the present invention in order that the detailed description that follows may be better understood, and in order that the present contributions to the art may be better appreciated. There are, of course, other features of the invention that will be described hereinafter and which will be for the subject matter of the appended claims.

In this respect, before explaining several preferred embodiments of the invention in detail, it is understood that the invention is not limited in its application to the details of the construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
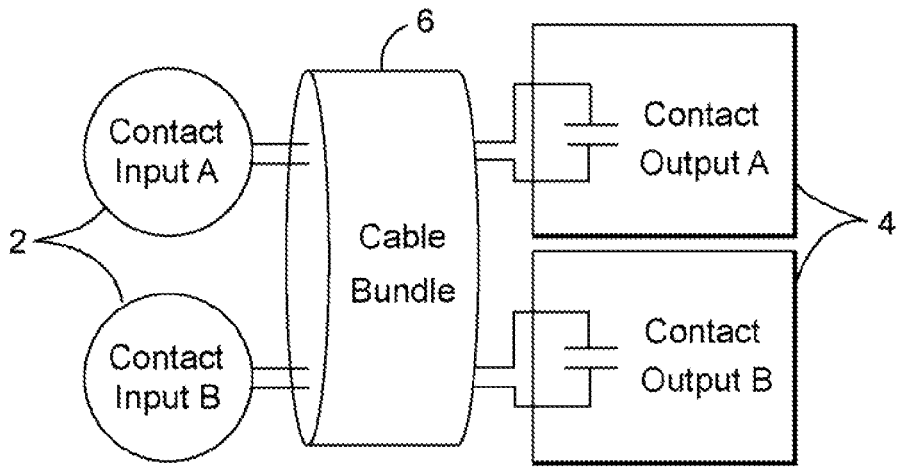
FIG. 1 illustrates a schematic of conventional contact inputs and outputs connected by a cable bundle.
Figure 2:
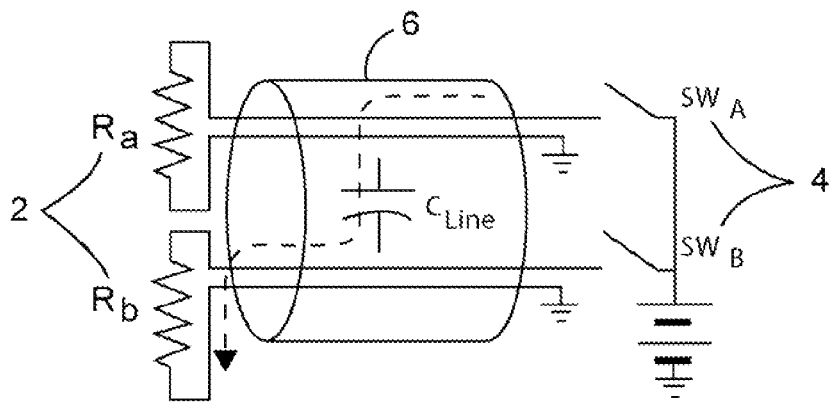
FIG. 2 illustrates an electronic circuit representation corresponding to the schematic of FIG. 1.
Figure 3:
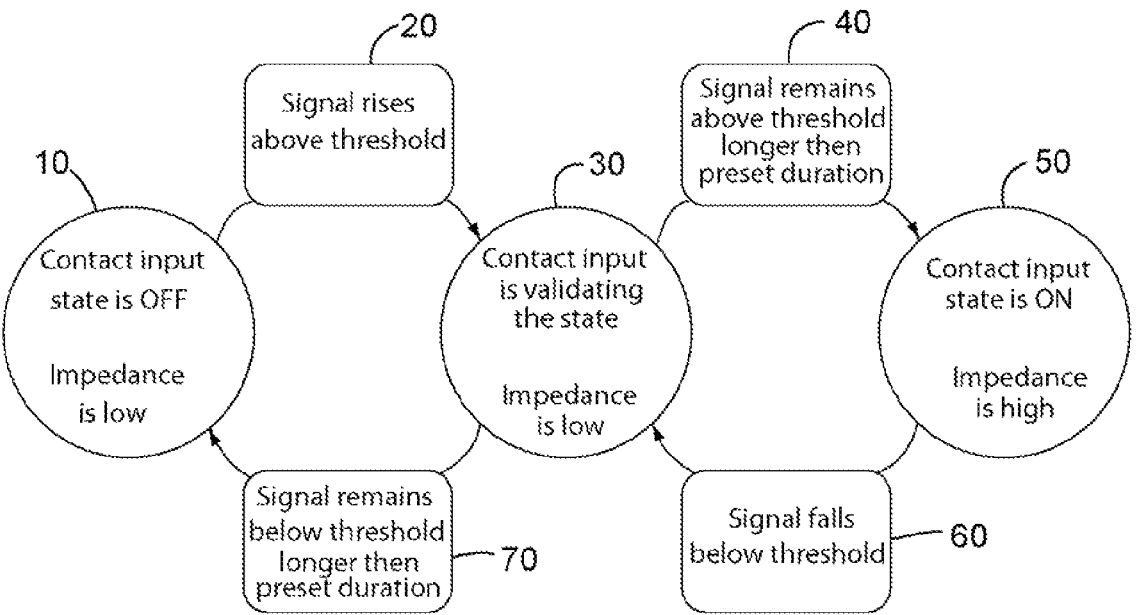
FIG. 3 illustrates a generalized flow chart of a method to recognize a change of state of a contact input in accordance with aspects of the present technique.

Referring now to the drawings, wherein like reference numerals designate identical or corresponding parts throughout the several views, a generalized method to actively control the impedance of a contact input is shown in FIG. 3. As referred herein throughout, adaptive active impedance, and its control, corresponds to adjusting a current draw or resistance of a measuring device during state transitions in order to optimize a response of the measuring device to a measured quantity that can be optimized by adjusting the impedance dynamically. Examples of measured quantities, include, but are not limited to, the response time and power consumption of an input contact. This allows for an improvement in response time without sacrificing the number of contact inputs and without increasing the amount of heat dissipated in the device containing the contact inputs, as it will be further explained below. In the description of exemplary embodiments that will follow, several examples are given of sample periods, different threshold values, and other quantities. As understood by those of ordinary skill in the applicable arts, those examples are to be taken as non-limiting, the proper scope of the present invention being determined only by the broadest interpretation of the appended claims so as to encompass all possible modifications and equivalents.

As shown in FIG. 3, the state of a contact input is initially OFF as well as its impedance is low at 10. The disclosed contact input change-of-state recognition process involves measuring the value on the input terminals and comparing that value against several thresholds, including, but not being limited to, a bounce threshold, a validate threshold, an active impedance, or AZ, threshold, and a low threshold. Once the contact input detects a communication signal from a contact output that is above the bounce threshold at 20, a process to validate the change of state of the contact input is initiated, while maintaining the impedance of the contact input low at 30. If the detected communication signal remains above the validate threshold longer than a preset duration at 40, indicative of a valid change of state from OFF to ON and not a transient due to, for example, a capacitively coupled signal, the state of the contact input and its impedance are changed to ON and high at 50, respectively. By lowering the impedance at 30 the time to discharge a capacitively coupled transient is accelerated, resulting in a reduction in the allowable debounce timer and an improvement in the response time. As further illustrated in FIG. 3, when the input is in the ON state, at 50, once the communication signal falls below an active impedance, or AZ, threshold value, at 60, the impedance is again lowered at 30 in order to improve the decay constant of the contact input in the presence of parasitic input capacitance. The process to validate a new change of state of the contact input is initiated when the input voltage falls below the low threshold at 60, where the input will change state if all measured values are below the low threshold for the validation time. At 70, if the newly detected communication signal remains below the low threshold longer than the preset duration or debounce timer value, the state of the input will change from ON to OFF. If the validation of the input fails and all values return to above the validate threshold at 40, for example due to a voltage sag, the contact input is switched back to the ON state and its impedance increased at 50. As such, the control of contact impedance is accomplished such that the current consumed by a contact input is increased only during the period of time when the input is in transition or when the input is in the OFF state, resulting in an overall reduction in power consumed since it is in these two situations that the power dissipation is minimized. Such an approach will not only allow the contact input to consume substantially less power than conventional contact inputs, but it will also improve the overall response time and reset time of a contact in the presence of parasitic capacitances.

In another embodiment of the invention, the contact input first detects a state transition of a contact output with a nominal wetting voltage through the continuous measurements of voltages present at the contact input terminals and comparison of those measurements to a threshold value. Once a state transition is detected, the contact input initiates a validation process to determine if a valid state change of the contact output took place. The detection of the state transition may include allowance for a bouncing contact signal. Contact bounce (also known as chatter) is a common characteristic of mechanical switches and relays. Switch and relay contacts are usually made of springy metals that are forced into contact by an actuator. When the contacts strike together, their momentum and elasticity act together to cause bounce. The result is a rapidly pulsed electrical current instead of a clean transition from zero to full current. The waveform is then further modified by the parasitic inductances and capacitances in the switch and wiring, resulting in a series of damped oscillations. This effect is usually unnoticeable in AC mains circuits, where the bounce happens too quickly to affect most equipment, but causes problems in some analog and logic circuits that are not designed to cope with oscillating voltages.

When detecting a bouncing contact signal, two thresholds may be used to de-bounce the signal, the first threshold being lower than the second. When the first threshold is reached (otherwise known as the bounce threshold) the contact input enters a bounce period, in which the contact input waits a predetermined time period, where the contact output is allowed to freely "bounce" between the ON and OFF states. Once the wait period is over, the contact input will then begin validating the contact input, whereupon the input will change its state to ON if the validation process is successful. When the bounce time is set to 0 ms, the input enters the validation period in the sample following the sample that reached the bounce threshold. In the application of detecting a valid state transition, after correctly determining the state of the contact input signal, a time in which the state transition occurred (otherwise known as the time stamp of the contact input event) is determined. Therefore, by entering the validation state through the use of a bounce threshold, which is lower than the validate threshold, the input becomes more sensitive to contact input transitions, thus improving time stamp accuracy.

The validation period (or the debounce timer when the bounce timer is set to zero) measures contact input values and compares them to the validate threshold. In one embodiment, a sliding window approach is used, where the contact input changes state once the contact input has detected valid measurements for an entire validation period. The contact will change state to ON if all samples within the sliding window are above the validate threshold and will enter the OFF state if all samples within the sliding window are below the low threshold.

If during validation, after the first validation period, the contact input has not validated to either an "ON" or "OFF" state, the contact input will remain in its previous state, activate an invalid flag, and continue the validation process. The input may fail validation and go invalid if there exists for one validation period either measured samples between the high and low threshold or there exists samples both above and below the high threshold. If the invalid flag remains high for at least a predetermined amount of time (e.g., 1 s), a trouble shooting flag will be set and an event will be generated, for system protection, the trouble shooting flag being reset after the contact input has not been invalid for a given time period (e.g., at least 2 s).

In another embodiment, once a change of state of the contact input is determined, including allowance for the bouncing contact signal, flexible logic operands may be used to indicate the state of the contact input. For example, a flexible logic operand may be provided for each contact input with states corresponding to "ON" and "OFF" while a second may be available to disclose contact input trouble. For example, the second operand may not go active unless at least one of the following conditions occur: (1) the contact input is considered as chattering; (2) the contact input has been in the invalid state for a given amount of time (e.g., 1 s); or the contact input has had a self detected hardware failure within that given amount of time.

The input contact of the present invention may also provide immunity against capacitively coupled signals. Capacitively coupled signals exist due to long parallel lines typically used in the wiring of contact inputs. These noisy pulses can last in excess of 25 ms, leading to false recognition of the contact input state or a delay in the recognition of valid contact input state transitions. The decay time of the capacitively coupled signal is proportional to the impedance of the contact input. The lower the impedance, the faster a capacitively coupled transient will dissipate resulting in shorter transient pulse durations. In the instant invention, dynamic impedance is used to minimize power dissipation during steady state operation, while maximizing noisy signal immunity during state transitions. This is accomplished as explained next.

Figure 4:
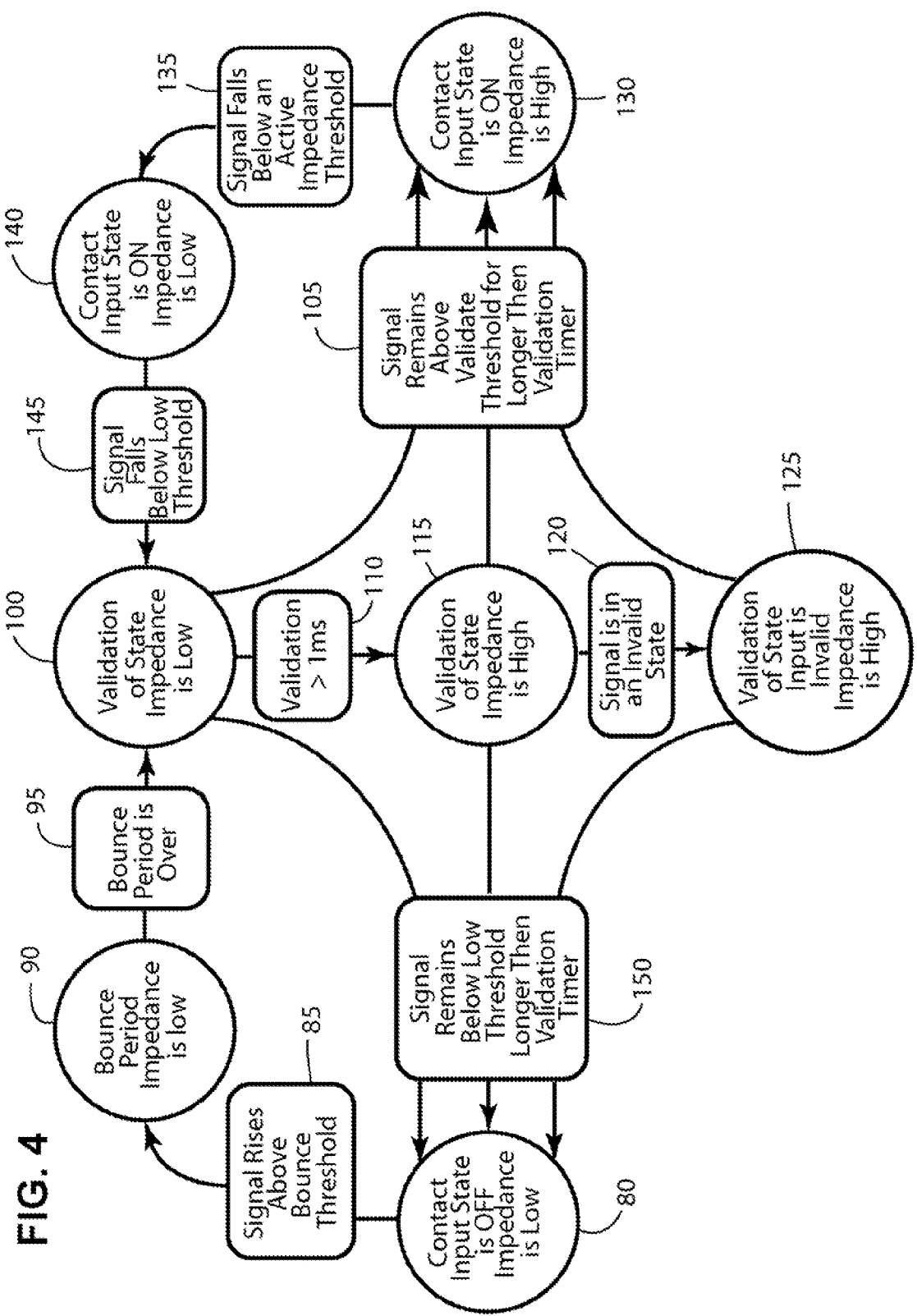
FIG. 4 illustrates another generalized flow chart of a method to recognize a change of state of a contact input in accordance with aspects of the present technique.

As illustrated in the state diagram shown in FIG. 4, at 80, if the contact input is OFF and the contact input impedance is low. If a contact output closure occurs, an increase in voltage will be seen on the contact input terminals and the voltage will increase above the bounce threshold (85) and the contact input will transition to the bounce state (90). The bounce state is a wait state used to optimize the contact input change-of-state recognition process by taking into account the bounce of a contact, which may be disabled (i.e., the change-of-state recognition process transitions on the subsequent sample period, e.g., in 250 µs, if that is the sample period). Once the wait period is over (95), the change-of-state recognition process will transition to the validation state, until either the input is validated or until a specified amount of time, e.g. 1 ms, has passed. If the input has not validated after 1 ms (110) the input will shut off the active impedance circuitry and continue validation (115). The 1-ms shutdown is due to the fact that the input would dissipate any transients within 1 ms. If the input successfully validates by measuring all samples within the validation period as being above the validate threshold (105), the input will transition to the ON state (130). If samples within the validation window were found to be both above the validate threshold and below the low threshold or if samples were found to be between both thresholds (120), the input will set the invalid flag and continue validation (125). If the input is ON and a measurement on the input terminals is found to be below the AZ threshold (135) the impedance will again be lowered (140). The impedance is lowered in this case in order to increase the discharge time of a contact input with parasitic capacitance on the input terminals. If the measurements across the inputs continue to decrease and fall below the low threshold (145) the input will again enter the validation state (100). If the input measurements stay below the low threshold (150) for the duration of the validation timer, the input will validate to OFF (80) and the impedance will remain low.

In order to protect the active impedance circuit from overheating during abnormal conditions, several safeguards have been incorporated in the disclosed invention. The first safeguard is the over-rating of the power-dissipating resistor by a pre-selected factor, e.g., a factor of 5. The second safeguard is to track and limit the amount of power dissipated through the use of a contact input thermal model. The thermal model continuously adds the measured power dissipation to an accumulator while simultaneously subtracting the steady state allowable power dissipation. Once the accumulator has reached the total allowable limit of power dissipation, the active impedance circuit is prevented from turning on. The accumulator will continue to decrease and will only un-block the active impedance circuit until a lower threshold is reached. In order to simplify the calculation of the total allowable power dissipation, the measured voltage in counts is directly added to the accumulator every sampling cycle, while the minimal allowable continuous voltage (25V) in counts is subtracted.

The input contact according to the present invention may also be configured to ignore contact chatter corresponding to continuously changing contact states. In order to ignore contact chatter the contact input detects if there is an excessive number of state transitions within a specified time period. If there are more than the user configured maximum number of state transitions within the user configured chatter period, a chatter detection alarm will turn on until there are no further state transitions for a period of time equal to a predetermined period, such as, for example, twice the chatter time.

Figure 5:
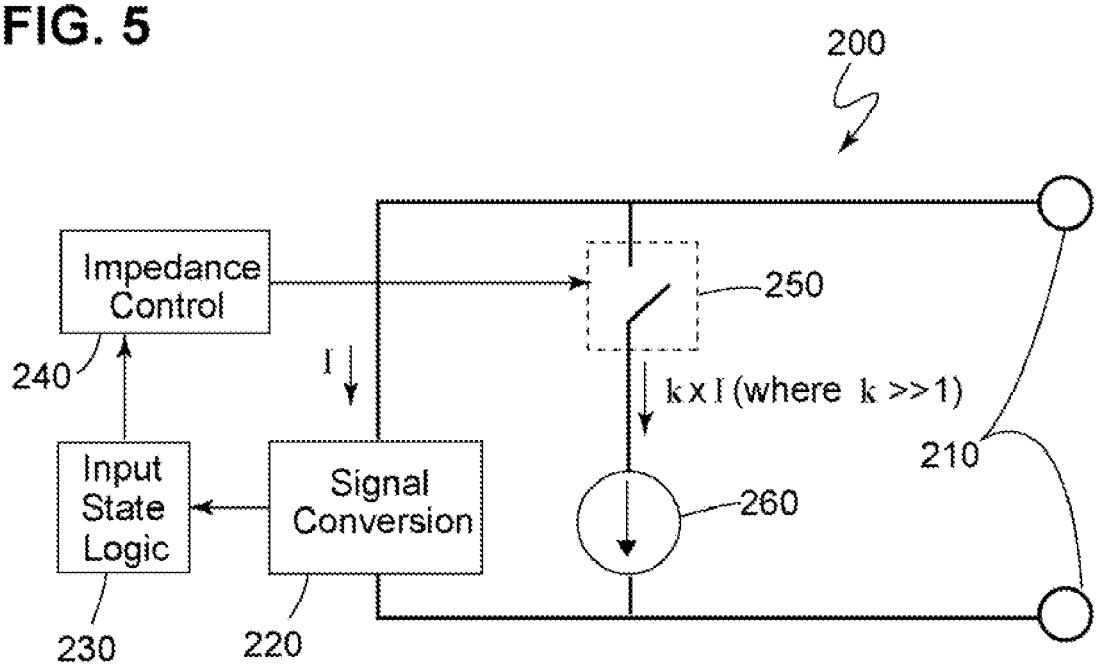
FIG. 5 illustrates a schematic of a circuit for recognizing a change of state of a contact input in accordance with aspects of the present technique.

An exemplary embodiment of a contact input with an active impedance circuit 200 in accordance with aspects of the present technique is illustrated in FIG. 5. As shown, the circuit that accomplishes active impedance involves a parallel current source 260 controlled by a microcontroller (not shown). The microcontroller performs several tasks: the recognition and conversion of the input signals by a signal converter 220, the validation/debounce change-of-state process recognition at an input state logic unit 230, as well as an actual control of the active impedance circuit 240. Signal conversion primarily involves the conversion of an input voltage supplied to contact inputs 210 to a binary quantity, but also involves compensating the measured voltage based on the state of the input impedance as determined by whether or not a circuit switch 250 is opened or closed. One embodiment of the change-of-state validation process may be as shown in FIG. 4 and involves the comparison of analog binary samples against the various thresholds in order to determine the current state of the contact input. Finally, the control of the active impedance circuit involves the determination of the state of the active impedance based on the state of the contact input, as well as the maximum power accumulated protection function. Once detected the current source 260 is switched in parallel to the contact input through the circuit switch 250.

In the circuit of FIG. 5, the current consumed by the contact input with the active impedance circuit 200 is increased only during the period of time when the contact input is in the OFF state or is in the process of validation, thus allowing the contact input to consume much less power than conventional contact inputs. The contact input with the active impedance circuit 20 of FIG. 5 having the illustrated active impedance system will not only allow the contact input to consume substantially less power than conventional contact inputs, but it will also improve the overall response time and reset time of a contact in the presence of parasitic capacitances.

Figure 6:
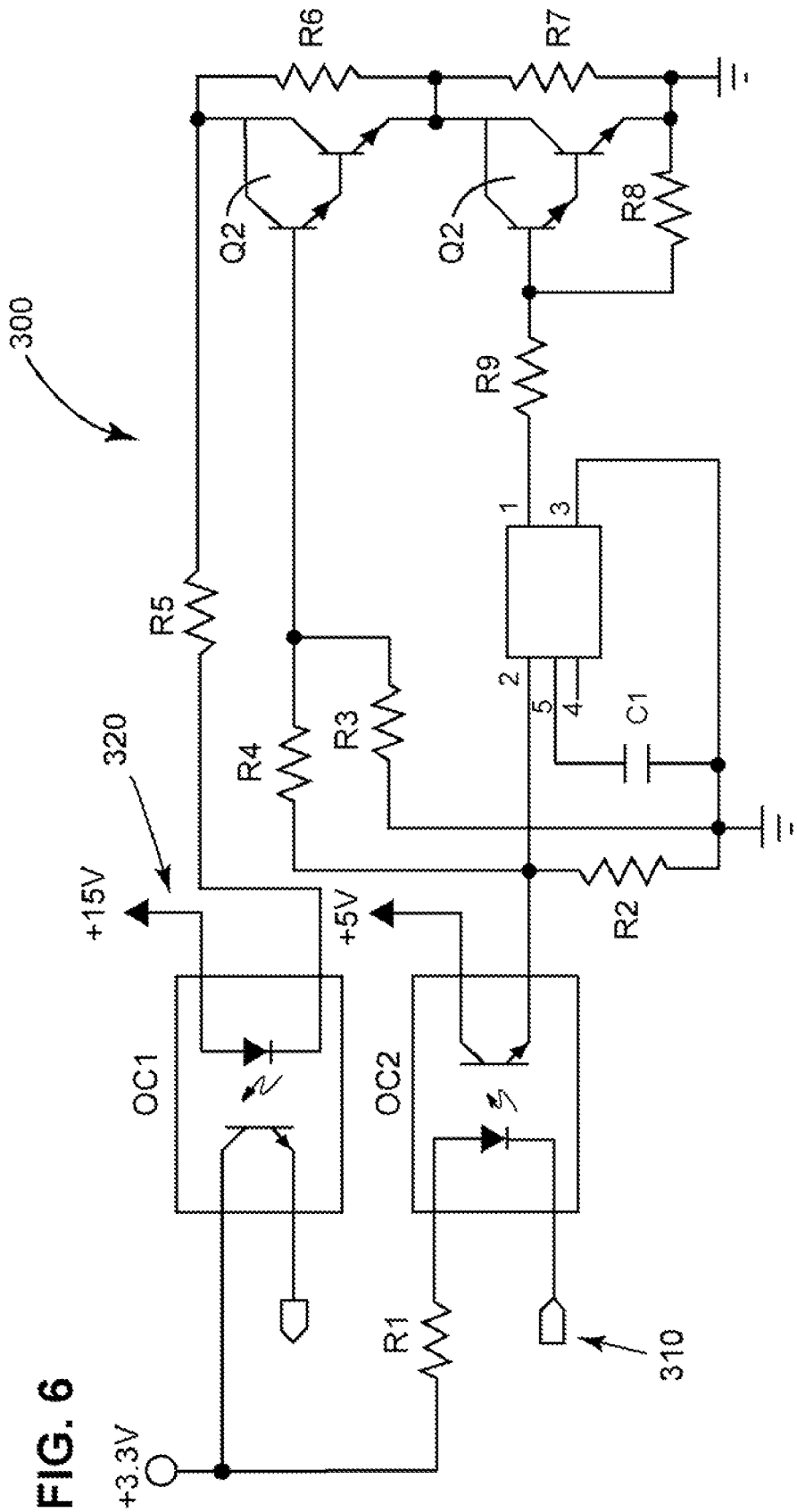
FIG. 6 illustrates a schematic of another circuit for recognizing a change of state of a contact input in accordance with aspects of the present technique.

Another embodiment of a contact input with an active impedance circuit 300 is illustrated in FIG. 6. Based on the subject matter disclosed herein, those of ordinary skill in the art will understand that, if due to parasitic capacitance there is a capacitively coupled signal on the contact input, the amount of current drawn by the input would effect the time to dissipate the capacitively coupled charge. In order to reduce this impedance, in this embodiment, a microprocessor sends a control signal at 310 to bias a phototransistor OC2, which in turn biases Darlington transistor Q2 and Q1. The Darlington transistor Q2 draws current from a locally generated contact input 15-volt rail at 320, increasing the overall current drawn by the contact input. The current produced is limited by a resistor R5, which is chosen as a 2512 package chip resistor that can handle up to 50 mA of current. In this particular embodiment, the current is limited to approximately 10 mA and is active while the input is in the OFF state or has been in the process of validation for 1 ms. The first Darlington transistor Q1 is controlled directly by the microcontroller, while the second transistor Q2 is controlled by the microcontroller through a 200-ms cut-off circuit. The 200-ms cut-off will only allow the transistor to be biased for 200 ms before automatically de-asserting. This is in order to ensuring that, if there is a failure in the circuit, excess current will not continuously flow through the contact input. In order for the microcontroller to ensure that the circuit is functioning correctly and in order to provide feedback for voltage compensation, the 10 mA current source is used to drive a feedback optocoupler OC1. The feedback allows the microcontroller to have a secondary signal verifying that a voltage is present and that the active impedance is functioning. As it will be appreciated by those of ordinary skill in the arts based on the subject matter disclosed herein, a contact input with active impedance allows for faster recognition times as well as increasing the density of contact inputs, thus improving recognition time and I/O density for a protection relay.

Figure 7:
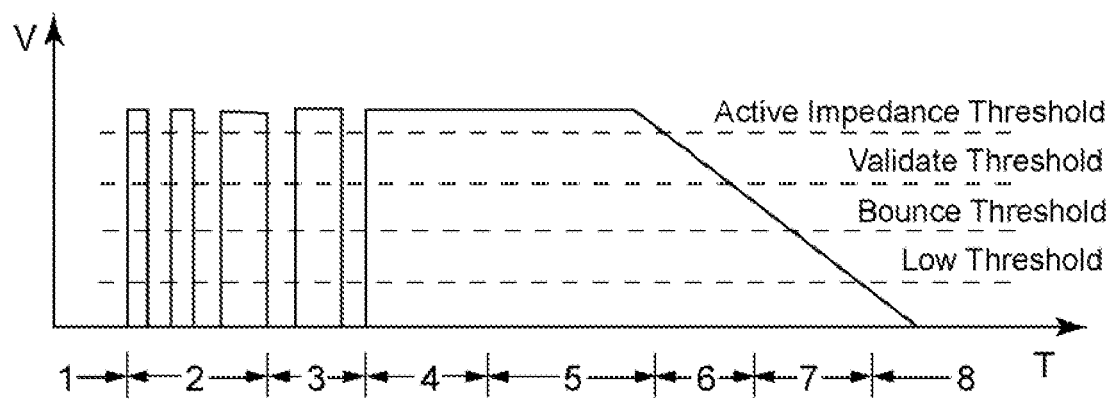
FIG. 7 illustrates a variation of voltage as a function of time with respect to several threshold levels for the circuit of FIG. 6.

With reference to the variation of voltage as a function of time with respect to several threshold levels illustrated in FIG. 7, the operation of the contact input with the active impedance circuit 300 of FIG. 6 will be explained. As illustrated, in this exemplary embodiment, in order to perform the above-summarized functions, the contact input utilizes a series of four threshold levels as shown in FIG. 7. The first threshold is the bounce threshold, which is used to detect the first bounce of a bouncing contact, and is therefore set at a lower and more sensitive level than the validate threshold.

In region 1 of FIG. 7, the contact input is in the OFF state and analog DC measurements are continuously taken at periodic intervals (e.g., every 250 µs) and measured against the bounce threshold. During this time the impedance is low. In region 2, the bounce threshold has been reached and the change-of-state recognition process begins the bounce period. During the bounce period, the contact ignores all measured values for the duration of the bouncing period and the contact input stays in the OFF state while the impedance is held low. Since the current default duration of the bounce period may be set to 0 ms, the contact will leave the bounce period after 250 µs. The impedance remains low for the entire duration of regions 1 and 2.

In region 3, the waiting period for the bounce period has been completed and the validation period begins. The contact input remains in the OFF state while the measured samples are compared against the validate threshold for the duration of the validation period (which may be equivalent to the debounce timer). If the contact output is bouncing the input will remain in the validation state until all samples are above the validation threshold.

In the example shown in FIG. 7, the input is in the validation state for both regions 3 and 4, however during region 3 the input can not validate to the ON state since the contact output is still bouncing. In region 4, the output has stopped bouncing and the input measures all samples within the validation period (which is equivalent to region 4 in this example) as being above the validate threshold. At the end of the validation period, the contact input will be validated as either ON, OFF or INVALID. If the debounce timer is set to 0 ms, then the contact input is validated on the sample following the bounce period. During validation the impedance is held low for only 1 ms, where the accuracy is reduced while the microcontroller compensates for the increased voltage drop across the input resistance caused by the increase in current. Due to this compensation the accuracy of the contact input is reduced for debounce timers of less than 1 ms. Once the change-of-state recognition process detects that all samples measured for the period of time defined by the validation period are over the validate threshold, the contact input moves to the ON state and validation ends. If all samples within the validate period are found to be below the low threshold value, then the contact input will move to the OFF state and the validation period will end. As already explained, the validation period may be considered as a "sliding window," moving along all the samples of the signal until all of the samples within the window are found to be above the validate threshold value or below the low threshold value. When the contact input transitions to the ON state the entire circuit is switched off.

In region 5, the contact input has successfully validated to the ON state. During the ON state the input impedance is high in order to reduce the power consumed by the input circuitry. All samples are measured by the input and compared against the active impedance threshold as well as the low threshold. As soon as the input voltage falls below the active impedance threshold, as shown in region 6, the impedance is again lowered. The active impedance threshold is set between the validate threshold and the nominal input voltage. The impedance is lowered in this case in order to improve the reset time of the contact input when parasitic capacitances exist on the input terminals.

In region 6, if the measured value drops below the active impedance threshold, but remains above the validate threshold for an extended time the maximum power accumulator protection process will be used to protect the contact input circuit against overheating. As previously explained, an accumulator may be used to track thermal dissipation. While the entire circuit is in the ON state, the voltage measured by the contact input will be added to the accumulator at fixed time intervals, e.g., every 250 μs. Additionally, regardless of the state of entire circuit, the maximum continuous voltage (a default value of 25V may be used) will be subtracted from the accumulator every 250-μs period. If the accumulator surpasses the maximum thermal threshold then the impedance control circuit will be blocked until the accumulator (which is continuously subtracting the maximum continuous voltage) reaches a lower thermal threshold.

In region, 8, the measured value has dropped below the low threshold for the validation period and the contact input has transitioned to the OFF state. In the OFF state the impedance is again held low while all measurements are continuously compared to the bounce threshold, as detailed in region 1.

Although an exemplary embodiment has been illustrated in conjunction with FIGS. 6 and 7, those of ordinary skill in the art will understand that several modifications of that embodiment within the scope of the invention disclosed are possible. For example, but not a limitation, a programmable potentiometer or a dynamic current source for variable impedance could be used rather than an ON/OFF dynamic current source. Also, pulse-width modulation may used to control the current source and provide variable impedance beyond an ON/OFF dynamic current source. In addition, the detection of temperature, for example, and not a limitation, through the use of a temperature sensitive resistors to compensate the impedance, could be used to improve heat response of the contact input and thus control the amount of heat being dissipated by the circuit.

Although the above-summarized embodiments have been directed to the connection of a contact input of a protection relay device to a breaker contact output in a power substation, those of ordinary skill in the art will understand that within the scope of the claimed invention, other applications include, but are not limited to, the use of contact output recognition in applications involving remote terminal units, or RTU, programmable logic controllers, or PLC, trip units, and other similar devices in applications involving, but not limited to, utility and industrial applications.

With respect to the above description, it should be realized that the optimum dimensional relationships for the parts of the invention, to include variations in size, form function and manner of operation, assembly and use, are deemed readily apparent and obvious to those skilled in the art, and therefore, all relationships equivalent to those illustrated in the drawings and described in the specification are intended to be encompassed only by the scope of appended claims.

In addition, while the present invention has been shown in the drawings and fully described above with particularity and detail in connection with what is presently deemed to be practical and several of the preferred embodiments of the invention, it will be apparent to those of ordinary skill in the art that many modifications thereof may be made without departing from the principles and concepts set forth herein. Hence, the proper scope of the present invention should be determined only by the broadest interpretation of the appended claims so as to encompass all such modifications and equivalents.

What is claimed is:

1. A method for recognizing a valid change of state in a communication signal received by a first input contact, the method comprising:
   maintaining the first contact input in a first state and an impedance of the first contact input at a first impedance level;
   validating that the communication signal sent to the first input contact is a valid change of state for the first input contact; and
   changing the first input contact to a second state; and
   adjusting the impedance of the first contact input to a second impedance level using adaptively active impedance when the communication signal is validated.

2. The method of claim 1, further comprising:
   verifying that the communication signal is above a first threshold value before the validating, wherein the validating comprises assuring that the communication signal remains above the first threshold value longer than a first predetermined duration, the first state is an OFF state, the second state is an ON state, and the second impedance level is higher than the first impedance level.

3. The method of claim 2, wherein the changing the impedance of the first input contact to the second impedance level comprises increasing a current consumed by the first input contact for a period of time while a voltage associated with the communication signal is below the first threshold value, the voltage being measured at a voltage measuring circuit in the first contact input, and then reducing the current a period of time after the voltage is above the first threshold, thereby reducing an amount of power consumed at the first input contact and improving an overall response time of the first input contact.

4. The method of claim 3, wherein the communication signal is a capacitively coupled signal.

5. The method of claim 1, further comprising:
   verifying that the communication signal is below a first threshold value before the validating, wherein the validating comprises detecting that the communication signal remains below the first threshold value longer than a first predetermined duration, the first state is an ON state, the second state is an OFF state, and the second impedance level is lower than the first impedance level.

6. The method of claim 5, wherein a reset time of the first contact input is reduced when the communication signal includes a parasitic capacitance signal.

7. The method of claim 5, wherein the changing the impedance of the first input contact to the second impedance level comprises increasing a current consumed by the contact input for a period of time when a voltage associated with the communication signal is below a voltage threshold, the voltage threshold being measured at a voltage measuring circuit in the first input contact.

8. The method of claim 1, wherein the communication signal is binary encoded.

9. The method of claim 8, wherein the detecting comprises providing an allowance for a bouncing contact signal.

10. The method of claim 8, wherein the detecting comprises ignoring contact chatter associated with changes in other contact states.

11. The method of claim 1, further comprising:
tracking an amount of power dissipated by the first input contact so as to prevent overheating the first input contact.

12. An input contact circuit, comprising:
a signal converter electrically coupled to input connections of the input contact circuit;
a switch electrically coupled to the input connections of the input contact circuit in parallel with the signal converter;
a current generator electrically coupled in series to the switch;
an impedance controller electrically coupled to the signal converter and the switch; and
an input state logic circuit electrically coupled to the signal converter and configured to change a state of the input contact from a first state to a second state.

13. The input contact circuit of claim 12, wherein the impedance controller is selected from the group consisting of a programmable variable impedance potentiometer, an on/off dynamic current source, a continuously variable current source with a pulse-width modulation, and a temperature sensitive resistor configured to compensate an impedance of the input contact circuit.

14. The input contact circuit of claim 12, further comprising:
a voltage measuring device disposed in the signal converter, wherein, when the voltage measuring device is configured to detect that a voltage associated with a communication signal applied to the input connections changes with respect to a first threshold for a period of time longer than a first predetermined time period, the input state logic circuit is configured to change the state of the input from the first state to the second state, and the impedance controller is configured to change an impedance of the input contact from a first impedance level to a second impedance level.

15. The input contact circuit of claim 14, wherein the voltage associated with the communication signal is above the first threshold for the period of time, the first state is an OFF state, the second state is an ON state, and the second impedance level is higher than the first impedance level.

16. The input contact circuit of claim 14, wherein the voltage associated with the communication signal decreases above the first threshold for the period of time, the first state is an ON state, the second state is an OFF state, and the second impedance level is lower than the first impedance level.

17. The input contact circuit of claim 16, wherein the impedance controller is configured to close the switch so as to increase a current consumed by the first input contact for a period of time while the voltage is below the first threshold value and then to open the switch so as to reduce the current a period of time after the voltage is above the first threshold, thereby reducing an amount of power consumed at the input contact and improving an overall response time thereof.

18. The input contact circuit of claim 16, wherein the impedance controller is configured to close the switch so as to increase a current consumed by the first input contact for a period of time when the communication signal is below a voltage threshold measured at a voltage measuring circuit in the first input contact.

19. The input contact circuit of claim 18, wherein the voltage associated with the communication signal is a capacitively coupled signal generated in a wire bundle connected to the input contact circuit.

* * * * *